(12) United States Patent
Chang

(10) Patent No.: US 8,034,248 B2
(45) Date of Patent: Oct. 11, 2011

(54) DRY ETCHING METHOD FOR OXIDE SEMICONDUCTOR FILM

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 502 days.

(21) Appl. No.: 11/802,276

(22) Filed: May 22, 2007

(65) Prior Publication Data

US 2007/0287296 A1 Dec. 13, 2007

(30) Foreign Application Priority Data

Jun. 13, 2006 (JP) .................... 2006-163464

(51) Int. Cl.
C23F 1/00 (2006.01)
H01L 21/461 (2006.01)
(52) U.S. Cl. .......................... 216/58; 438/706
(58) Field of Classification Search .......... 216/58; 438/706, 718
See application file for complete search history.

(56) References Cited

U.S. PATENT DOCUMENTS

| | | | | |
|---|---|---|---|---|
| 5,068,007 A | * | 11/1991 | Rogers et al. ................. | 438/718 |
| 6,284,393 B1 | * | 9/2001 | Hosokawa et al. ............ | 428/690 |
| 6,617,056 B1 | | 9/2003 | Hara et al. .................... | 428/697 |
| 7,061,014 B2 | | 6/2006 | Hosono et al. ................ | 257/43 |

FOREIGN PATENT DOCUMENTS

| | | |
|---|---|---|
| EP | 1 737 044 | 12/2006 |
| JP | 3-77209 | 4/1991 |
| JP | 6-338223 | 12/1994 |
| JP | 10-87301 | 4/1998 |
| JP | 11-335874 | 12/1999 |
| JP | 2004-103957 | 4/2004 |
| WO | 00/51139 | 8/2000 |
| WO | 2005/088726 | 9/2005 |

OTHER PUBLICATIONS

Elvira M. C. Fortunato, et al., "Fully Transparent ZnO Thin-Film Transistor Produced at Room Temperature", Advanced Materials, vol. 17, No. 5, Mar. 8, 2005, pp. 590-594.
Kenji Nomura, et al., "Room-temperature fabrication of transparent flexible thin-film transistors using amorphous oxide semiconductors", Nature, vol. 432, Nov. 25, 2004, pp. 488-492.

* cited by examiner

*Primary Examiner* — Shamim Ahmed
*Assistant Examiner* — Patti Lin
(74) *Attorney, Agent, or Firm* — Fitzpatrick, Cella, Harper & Scinto

(57) ABSTRACT

Provided is a dry etching method for an oxide semiconductor film made of In—Ga—Zn—O, in which an etching gas containing a hydrocarbon is used in a dry etching process for the oxide semiconductor film made of In—Ga—Zn—O formed on a substrate.

4 Claims, 3 Drawing Sheets

DRY ETCHING METHOD FOR OXIDE SEMICONDUCTOR FILM

BACKGROUND OF THE INVENTION

1. Field of the Invention

The present invention relates to a dry etching method for an oxide containing In, Ga, and Zn (hereinafter, referred to as "In—Ga—Zn—O"), and more particularly, to a dry etching method for an oxide semiconductor In—Ga—Zn—O in manufacturing microelectronic components such as a semiconductor element, a semiconductor integrated circuit, ° and an electrode.

2. Description of the Related Art

As described in Japanese Patent Application Laid-Open No. 2004-103957, in recent years, research and development regarding a semiconductor film made of In—Ga—Zn—O and growth conditions for the semiconductor film have been conducted.

K. Nomura et. al, Nature, vol. 432, 25 Nov. 2004, p. 488-492 and E. M. C. Fortunato et. al, Advanced Materials, 2005, 17, No. 5, p. 590-594 disclose that patterning of a produced film made of In—Ga—Zn—O or a film made of Ga—Zn—O has been performed by a lift-off method.

Regarding the dry etching, it is known that Japanese Patent Application Laid-Open No. H11-335874 discloses a technique in which a process gas containing methane is used for a dry etching method for a transparent oxide conductive film made of, for example, zinc oxide (ZnO).

Further, Japanese Patent Application Laid-Open No. H03-077209 discloses that, when a transparent conductive film made of an ITO formed on a glass substrate is subjected to dry etching, reactive dry etching using a mixture gas of hydrogen and hydrocarbon is employed while heating an ITO film. In addition, Japanese Patent Application Laid-Open No. H10-087301 discloses that a conductive film mainly made of $SnO_2$, $In_2O_3$, and ZnO is subjected to dry etching by using hydrogen iodide.

In the conventional semiconductor dry etching, a fluorine-based gas is generally used as an etching medium.

However, the lift-off method has a problem in that a photoresist is melted and deformed at high temperature. Further, the lift-off method has another problem in that, in removing a photoresist, a patterned edge of a film to be vapor-deposited rides up, with the result that wirings provided through the patterned edge are liable to be broken and the production yield is low.

Further, the photoresist patterned by a photolithography process is used as an etching mask for reactive ion etching (RIE). In this case, there arises a problem in that it is difficult to remove a nonvolatile material, which is deposited on a surface of the resist after the etching, even by cleaning with supersonic waves.

Accordingly, it is necessary to process the film made of In—Ga—Zn—O, and various etching methods are under review in order to obtain a film having excellent reproducibility and a desired shape. There are two main types of etching methods, that is, wet etching in which a sample is immersed in a chemical agent, and dry etching in which an etching medium having a gas phase is used. In principle, in the wet etching method, etching advances isotropically, which raises a problem in that a phenomenon such as undercut of a lower portion of a mask, corrosion of a pattern due to adhesion failure between a mask and a coated film, or penetration of an etchant occurs. Further, there arises another problem in that etching residues float and remain on a device. Accordingly, replacement of the etchant is required at high frequency, which may lead to a large consumption of the etchant.

On the other hand, the dry etching method is advantageous in that chemically active ions generated in plasma are vertically made incident on a surface of a processed material due to directivity of the ions, whereby a processed shape has faithful processing characteristics for the mask pattern.

As a general dry etching method, a reactive ion etching (RIE) method is employed. A principle of the RIE is simply described as follows. An etching gas is introduced in a vacuum container having a parallel plate electrode, and high frequency power is applied to the electrode. Then, the etching gas is ionized by electrons which are rapidly accelerated due to a high frequency electric field, to thereby obtain a plasma state of the etching gas. Neutral active species (radicals) or ions generated in the plasma react on the substrate surface, which advances etching. A basic reaction mechanism is described as follows. As one example of the etching in which chemical reaction is dominant, active species are adsorbed to produce secondary products, and the active species are desorbed, thereby advancing etching. As another example of the etching in which a sputtering effect is dominant, accelerated positive ions collide with the substrate, and the substrate is physically etched.

However, the above-mentioned cited references do not disclose a specific dry etching for In—Ga—Zn—O, or include embodiments thereof. The dry etching of the film made of In—Ga—Zn—O using $CF_4$ is disadvantageous for mass production in that the etching rate is as low as 20 angstrom/min. Further, etching selectivity with respect to a generally used insulating film (e.g., SiN or SiO) is low.

Further, in the dry etching method disclosed in Japanese Patent Application Laid-Open No. H03-077209, there arises a problem in that, in a case where an ITO is not heated, In and a carbon-based deposit are formed on the ITO film, and a predetermined configuration pattern is hardly obtained. Further, Japanese Patent Application Laid-Open No. H03-077209 does not disclose possibility of use of the dry etching for the film made of In—Ga—Zn—O, and the etching rate.

In the conventional dry etching for a semiconductor made of, for example, silicon, a fluorine-based gas is used as an etching medium in many cases. The dry etching of the film made of In—Ga—Zn—O using $CF_4$ is disadvantageous for mass production in that the etching rate is as low as 20 angstrom/min. according to the experimental results. Further, the etching selectivity with respect to SiN, SiO, or the like generally used for an insulating film is low.

On the other hand, in a case of using a halogen gas, examples of a product that is reacted with an In—Ga—Zn—O film may include a halide containing In, Ga, and Zn, such as $GaF_3$, $GaCl_2$, $GaCl_3$, $GaBr_3$, $InF_3$, InCl, $InCl_2$, $InCl_3$, $InBr_2$, $ZnF_2$, and $ZnCl_2$. Those halides have a boiling point of 1000° C., 535° C., 201° C., 279° C., 1200° C., 608° C., 560° C., 600° C., 632° C., 1243° C., and 428° C., respectively. Those halides each have a high boiling point of the reactive product, a low volatility, and a low vapor pressure. Accordingly, if the substrate temperature during the etching is not set high, the reactive product cannot be desorbed and are redeposited, which raises a problem of polluting an etching chamber. Further, when a plastic film resin substrate is used, it is undesirable to perform etching using the halogen gas since the resin substrate normally has a low heat resistance. In particular, the plastic resin substrate has a low etching resistance with respect to the plasma of the halogen gas. For this reason, the substrate surface may be made rough and may have irregularities. In a case where the irregularities are formed on the substrate surface as described above, wirings may be broken by steps of the irregularities, which reduces the production yield.

SUMMARY OF THE INVENTION

In order to solve the above-mentioned problems, it is an object of the present invention to provide a method of processing a film made of In—Ga—Zn—O with high processing accuracy. That is, it is an object of the present invention to provide a dry etching method for a film made of In—Ga—Zn—O using an etching gas containing a hydrocarbon with a high processing accuracy and a high etching rate.

In order to solve the above-mentioned problems, the present invention has achieved the dry etching method for an oxide semiconductor film as a result of a keen study of a film made of In—Ga—Zn—O, growth conditions therefor, and etching conditions therefor.

According to the present invention, there is provided an etching method for an oxide semiconductor film containing at least In, Ga, and Zn, including etching in a gas atmosphere containing a hydrocarbon.

According to the present invention, it is possible to prevent adverse effects of a reaction deposit from occurring. As a result, in dry etching for a film made of In—Ga—Zn—O, it is possible to reliably obtain a high etching rate, uniformity, and cleaning of a plasma reaction chamber.

For example, in a manufacturing process for a transistor device in which a transparent semiconductor oxide film made of In—Ga—Zn—O is used as a channel layer of a thin film transistor on a substrate, practical etching with excellent reproducibility can be performed.

Further features of the present invention will become apparent from the following description of exemplary embodiments with reference to the attached drawings.

DESCRIPTION OF THE EMBODIMENTS

Figure 1:
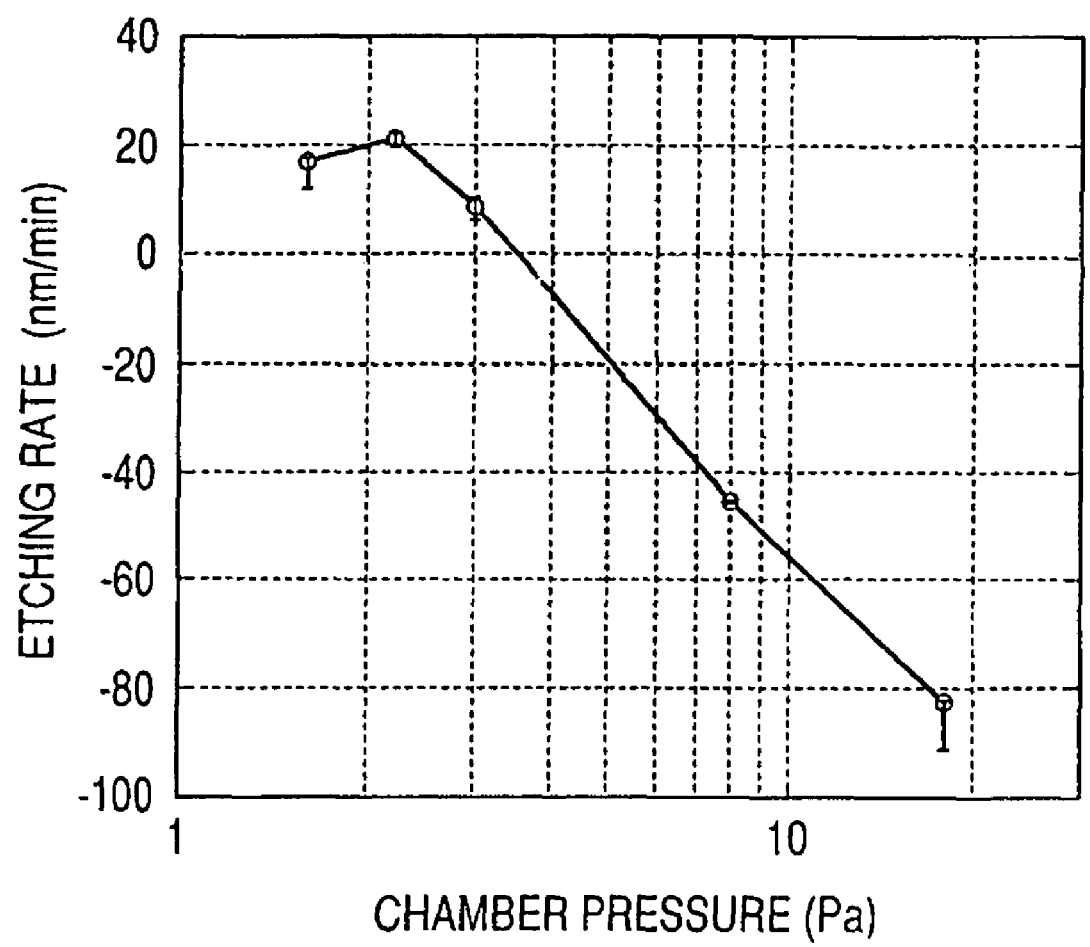
FIG. 1 is a characteristics graph illustrating a relationship between a pressure and an etching rate according to the example of the present invention.

According to knowledge of the inventor of the present invention, in a case of etching using a hydrocarbon gas, examples of a product reacted with an In—Ga—Zn—O film may include a compound containing In, Ga, Zn, and a methyl group, such as, $In(CH_3)_3$, $In(C_2H_5)_3$, $Ga(CH_3)_3$, $Ga(C_2H_5)_3$, $Zn(CH_3)_2$, and $Zn(C_2H_5)_2$. Those organic metal compounds have a low boiling point of 134.0° C., 184.0° C., 55.7° C., 143.0° C., 44.0° C., and 117.6° C., respectively, and each have a high volatility and a high vapor pressure. It is assumed that, by setting a substrate temperature during etching to the above-mentioned boiling point or higher (desirably about 200° C. in a case where a substrate has a heat resistance), secondary products such as $In(CH_3)_3$, $Ga(CH_3)_3$, and $Zn(CH_3)_2$ are desorbed from the substrate. In other words, it is assumed that the etching has a mechanism in which the chemical reaction effects are dominant.

In a case of using a dry etching gas containing a hydrocarbon, the pressure is desirably set within a range of 0.6 Pa to 3.5 Pa as a condition. In a case where a pressure is lower than the pressure of the range, the gas itself is mainly discharged, and it is difficult to maintain an amount of the gas sufficient for forming a discharge, in an apparatus. On the other hand, in a case where the pressure is higher than the pressure of the range, a neutral gas which is not dissociated by plasma mainly exits, and the neutral gas collides with dissociated ions, which results in reducing an etching rate. In addition, a large amount of nonvolatile material, which may cause a problem, are likely to generate.

Further, in the dry etching for the film made of In—Ga—Zn—O by utilizing high-frequency plasma, it is possible to perform the dry etching at a high speed without generating a nonvolatile deposit at a room temperature.

Further, an electrode applied with a high RF power is collided by positive ions having high kinetic energy, thereby obtaining effects of physical sputtering and increase of the temperature. When the dry etching gas containing a hydrocarbon is used, an RF power density is desirably set, as a condition, in a range of 0.1 W/cm$^2$ or more to 20 W/cm$^2$ or less, more desirably, in a range of 0.6 W/cm$^2$ or more to 10 W/cm$^2$ or less, and most desirably, in a range of 1.9 W/cm$^2$ or more to 6 W/cm$^2$ or less. In a case where an RF power density is lower than RF power density of the range, only a small effect of the etching can be obtained and a large amount of nonvolatile carbide, which may cause a problem, is likely to generate. In a case where the RF power density is 2 W/cm$^2$ or more, the nonvolatile material can be excellently removed.

On the other hand, under a condition that the RF power density is higher than the RF power density of the range, an electron temperature of plasma is high, and a plasma resistance of a photoresist is low. As a result, the film made of In—Ga—Zn—O cannot be maintained until the film is sufficiently etched. In addition, in a case of using a resin substrate made of, for example, plastic, the plasma temperature is high, and the resin substrate having a low heat resistance may be softened to be deformed or melted.

When the film made of In—Ga—Zn—O is subjected to etching for a long period of time, the plasma temperature rises and a plasma dissociation degree is increased, thereby rapidly increasing a formation rate of the nonvolatile material. Considering the use of the dry etching gas containing a hydrocarbon and an etching selectivity with respect to a photoresist, a film thickness of the oxide semiconductor is desirably set in a range of 1 nm or more to 2 mm or less as a condition. In order to prevent deposition of the nonvolatile product, the film thickness is more desirably set in a range of 5 nm or more to 200 nm or less. In a case where the film thickness is smaller than the film thickness of the range, it is difficult to cause excitation of plasma by accurately supplying a gas for a short period of time by using a gas supply system or plasma power source of an etching apparatus, and by performing matching. When an etching error occurs, there is a fear that a substrate under the film may be subjected to etching, so a plastic resin substrate must be used with special care. As long as the thickness of the oxide semiconductor film is 200 nm or smaller, the film can be efficiently removed without generating a large amount of nonvolatile material.

Conductivity of the oxide semiconductor film made of In—Ga—Zn—O strongly depends on temperature. In order to keep the conductivity constant, it is desirable to perform etching at low temperature. If the etching is performed for a long period of time, the substrate temperature rises and the conductivity increases. As a result, it is possible that a TFT having the transparent conductive oxide amorphous thin film used as a channel layer cannot be turned off. For this reason, it is necessary to cool the substrate to be etched with a coolant. Note that in order to prevent the secondary products from being redeposited since the secondary products cannot vaporize by an excessive amount of coolant, in the dry etching process, there exits an optimum temperature range. Considering the above-mentioned relationship, the substrate surface temperature when the dry etching gas containing a hydrocarbon is desirably set in a range of −20° C. or more to 200° C. or less as a condition. Further, in order to obtain a stable TFT dynamic characteristics, the substrate temperature is more desirably set in a range of 10° C. or more to 160° C. or less. It is desirable that the substrate surface temperature is set to be higher than a boiling point of a reaction product. Further, the substrate surface temperature for a plastic polymeric resin substrate having a low heat resistance and low plasma resistance is most desirably set in a range of 20° C. or more to 85° C. or less. By setting the substrate surface temperature in the range, sufficient etching can be performed due to a physical impact of ions in plasma.

Further, with regard to etching of the resist which is patterned by a known photolithography process as an etching mask, it is extremely important to perform a hard baking process for the patterned resist. The hard baking process is performed to enhance the plasma resistance of the resist in a case of reactive dry etching to be subsequently performed. However, excessive baking makes the resist harder. In addition, there arises a problem in that nonvolatile materials are deposited on a surface of the resist after the etching, and the deposited nonvolatile materials are hardly removed even by cleaning with supersonic waves. In a case of using a normal positive resist, the hard baking is desirably performed using a baking furnace at about temperature of 90° C. or more to 140° C. or less and for about 10 minutes or more to 30 minutes or less.

In the present invention, a mixture containing a hydrocarbon and a gas for dilution is used as a process gas. Among examples of the gas for dilution including helium, neon, argon, krypton, xenon, and hydrogen, particularly, argon (Ar) is desirably used. Those gases for dilution have a function of stabilizing plasma and a function of preventing In, Ga, Zn, O, C, and the like from being polymerized and deposited. In particular, it is expected that those gases are expected to enhance an anisotropic etching property. When a dry etching gas in which argon is mixed with a hydrocarbon is used, an argon ratio is desirably set in a range of 5 mol % or more to 80 mol % or less as a condition, and more desirably in a range of 20 mol % or more to 75 mol % or less.

When an argon ratio is lower than the argon ratio of the range, a large amount of nonvolatile carbide, which may cause a problem, is likely to generate. On the other hand, when the argon ratio is higher than argon ratio of the range, the etching selectivity with respect to the photoresist used as an etching mask is reduced to a large extent by dilution of the hydrocarbon gas. As a result, it the film made of In—Ga—Zn—O having a large thickness cannot be sufficiently etched in some cases. Further, when a resin substrate made of, for example, plastic is used, positive ions collide with the resin substrate, so the resin substrate having a low heat resistance and a low plasma resistance is liable to be etched. According to the knowledge of the inventor of the present invention, it is found that excellent production yield of the TFT can be obtained by setting the ratio of Ar in the mixture gas of a hydrocarbon and Ar in a range of 20 mol % or more to 75 mol % or less.

Further, it is also possible to mix a hydrogen gas. However, in a case where a large amount of hydrogen gas is mixed, a dilution rate of the hydrocarbon gas is large, which may lower the dry etching capability of the hydrocarbon gas. The amount of the hydrogen gas is desirably an equivalent amount of the hydrocarbon gas or lower. More desirably, the ratio of hydrogen is in a range of 25% or more to 45% or less. In the range, the etching rate hardly decreases and the deposition of the nonvolatile products can be reduced. It is assumed that this is because a redeposition probability of atoms to be etched becomes lower due to a reduction effect of hydrogen. By applying the present invention to the process for the semiconductor devices in which the oxide semiconductor film made of In—Ga—Zn—O is used as an active layer, it is possible to significantly enhance the production yield. In particular, the present invention is effective in a case of using a substrate having a large area.

It should be noted that the active layer of the semiconductor device can be produced by a thin film formation method selected from a sputtering method, a vapor deposition method, a CVD method, an epitaxial growth method, a photoexcitation deposition method, a pulsed laser vapor deposition method, and an ion plating method. From the viewpoint of mass productivity, the sputtering method is most suitable.

It should be noted that, with regard to a material for the amorphous transparent oxide thin film, it is possible to add at least one of impurities such as Sn, Al, Sb, Cd, Ge, P, As, N, and Mg to a compound made of In—Ga—Zn—O.

Further, it is desirable that deposition is performed in an atmosphere containing an oxygen gas without intentionally adding impurity ions for increasing an electrical resistance of the amorphous transparent oxide thin film.

Further, in order to produce a TFT in which an amorphous transparent oxide thin film made of In—Ga—Zn—O is used as an active layer, it is desirable that the oxide semiconductor film is made of In—Ga—Zn—O, and the electron carrier concentration is less than $10^{18}/cm^3$. Further, the electron carrier concentration of the transparent amorphous oxide film is desirably $10^9/cm^3$ or more for the same reason.

It should be noted that In—Ga—Zn—O may be manufactured by a pulsed laser deposition (PLD) method or a reactive solid-phase epitaxy (R-SPE) method. Further, a single crystalline or polycrystalline film may be made of In—Ga—Zn—O. An etching rate of the single crystalline or polycrystalline film is extremely lower than the etching rate of an amorphous film, and a roughness of an etched surface of the single crystalline or polycrystalline film is large. The present invention is effective in etching of the crystalline film.

Further, a hydrocarbon is desirably used in the present invention, but other materials can be used as long as the material is capable of generating radicals or ions of an alkyl group by plasma and gasifying a metal contained in the oxide semiconductor film. The same effects can be obtained by using, for example, ethane ($C_2H_6$), propane ($C_3H_8$), butane ($C_4H_{10}$), ethylene ($C_2H_4$), propylene ($C_3H_6$), or acethylene ($C_2H_2$).

Further, various plasma sources can be applied to the present invention, as long as the plasma source is capable of generating radicals or ions of a halogen element by plasma and gasifying a metal contained in the oxide semiconductor film. Examples of the plasma source include a reactive ion etching (RIE) apparatus of a parallel plate type (capacity coupling type), a high frequency inductively coupled plasma (ICP) etching apparatus, an electron cyclotron resonance (ECR) etching apparatus, a magnetron plasma etching apparatus, and a barrel type plasma etching apparatus. The same effects can be expected by using a down flow etching apparatus.

EXAMPLES

Hereinafter, specific examples of a dry etching method for a film formed on In—Ga—Zn—O according to the present invention will be described. The following examples are described under a desirable conditions within the gist of the present invention. However, the present invention is not limited to those conditions.

First, a sample for the example was produced by the following procedure. An Si substrate (having a thickness of 525 mm) having an Si thermally-oxidized film adhered thereto with a thickness of 100 nm is used as a substrate. Under conditions represented in Table 1 described below, an In—Ga—Zn—O film was formed with a thickness of 900 nm by using a reactive sputtering method.

TABLE 1

| Target | In—Ga—Zn—$O_4$ |
|---|---|
| Substrate Temperature | Room Temperature |
| Ar Flow Rate | 50 sccm |
| $O_2$ Flow Rate | 0.6 sccm |
| Pressure | 0.326 Pa |
| RF power | 150 W |
| Time | 40 min |
| Film Thickness | 900 nm |

It should be noted that the film thickness was 900 nm, but a depth obtained through the actual etching was 350 nm or lower. In particular, in order to prevent nonvolatile materials from being deposited, the thickness of the film to be etched is most desirably 200 nm or smaller. By employing a sputtering deposition method with a polycrystalline sintered body containing an In—Ga—Zn—$O_4$ composition being used as a target, an In—Ga—Zn—O based amorphous oxide semiconductor thin film was deposited. Further, when the In—Ga—Zn—O based thin film was subjected to diffraction of an incident X-ray (at incident angle of 0.5 degrees), a distinct diffraction peak was not found. Accordingly, it can be said that the produced In—Ga—Zn—O based thin film was in an amorphous state.

Next, a resist pattern with lines and spaces, in which a line width and a space width are each 3 mm, was formed on the In—Ga—Zn—O film by the known photolithography process. Positive resist AZ 1500 (20 cp) manufactured by Clariant was used as a resist. The Si substrate with the resist was subjected to hard baking by using a baking furnace at about temperature of 120° C. and for about 10 to 30 minutes, thereby producing the sample for the example. The hard baking process is performed for enhancing the plasma resistance of the resist at the time of reactive dry etching to be performed later.

Then, the In—Ga—Zn—O film exposed from the resist pattern on the sample was subjected to dry etching using an etching gas containing a hydrocarbon. L-201D-L etching apparatus manufactured by ANELVA Corporation (present Canon ANELVA Corporation) was used as a dry etching apparatus. The etching apparatus employs a reactive ion etching (RIE) process which is performed by providing a substrate to a cathode electrode using a general power source having a high frequency of 13.56 MHz of a capacity coupling type. The sample was put in a chamber and vacuuming was performed. After a sufficient vacuum degree of $2 \times 10^{-4}$ Pa or lower was obtained, plasma excitation was performed by flowing each gas, and etching was performed under various conditions.

The resist of each sample is removed by acetone after the etching, the pattern of the In—Ga—Zn—O film was measured and observed. A step obtained through etching was measured by a step measuring device available from KLA-Tencor Corporation, and a dry etching rate was calculated with accuracy. As a result of the following examples, appropriate etching conditions were found.

Example 1

In Example 1, pressure dependency of an etching effect was observed. The observation of the pressure dependency was performed under such conditions that temperature was set to a room temperature, a pure $CH_4$ flow rate was 38.7 sccm, and an RF power was 100 W (2.2 W/cm$^2$). Results of the observation are illustrated in FIG. 1. An axis of abscissa indicates a chamber pressure, and an axis of ordinate indicates an etching rate. In FIG. 1, each negative value of the etching rate indicates a formation rate of a deposit. As a result, it was found that the dry etching can be excellently performed without forming a nonvolatile deposit in a case where the pressure was 3.5 Pa or lower. Note that, in the etching apparatus of this example, it was found that plasma was hardly excited in a case were the pressure was 0.6 Pa or lower. The lower the reactive pressure is set, the more the generation of the deposit can be suppressed. Accordingly, as long as the plasma can be excited at lower pressure, an etching apparatus having higher degree of vacuum may be used.

In a case where the pressure is 3.5 Pa or more, the nonvolatile deposit may be formed. The formed nonvolatile deposit is undesirable since it can be hardly removed by an organic solvent such as acetone. This is because the higher the pressure becomes, the more the deposition rate increases. A composition of the deposit was analyzed by EDX, and a composition like the In—Ga—Zn—O film was found. For this reason, it is assumed that sputtered atoms were redeposited while the etching actually progresses. As apparent from the results, the pressure is most desirably set in a range of 0.6 Pa or more to 3.5 Pa or less as a condition.

Example 2

Figure 2:
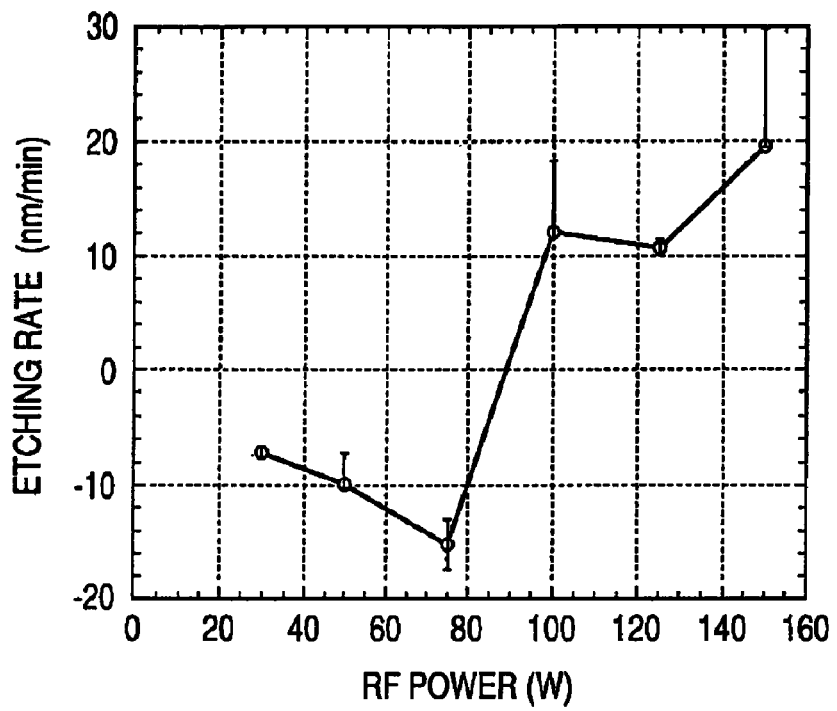
FIG. 2 is a characteristics graph illustrating a relationship between an RF power and an etching rate according to the example of the present invention.

In Example 2, a relationship between an etching effect and an RF power was observed. The observation was performed under such conditions that temperature was set to a room temperature, a pure $CH_4$ flow rate was 38.7 sccm, and a chamber pressure was 2.6 Pa. Results of the observation are illustrated in FIG. 2. An axis of abscissa indicates an RF power, and an axis of ordinate indicates an etching rate. In FIG. 2, each negative value of the etching rate indicates a formation rate of a deposit. As apparent from FIG. 2, it was found that the dry etching can be excellently performed without forming a nonvolatile deposit in a case where the RF power was 90 W or more. In a case were the RF power is 90 W or lower, the nonvolatile deposit is formed. It is assumed that, this is because, ions in the plasma have high kinetic energy when the RF power is high, and if a deposit may be formed, the deposit is to be etched again. In the etching apparatus of this example, an applied electrode has a diameter of 3 inches, and the RE power 90 W has an RF power density of about 2 W/cm². As apparent from the results, the RF power density is most desirably set to 2 W/cm² or more as a condition.

It should be noted that the power density of the present invention indicates electric power to be applied to a discharge electrode (electrode to which electric power for excitation of plasma is applied) per unit area.

Example 3

Figure 3:
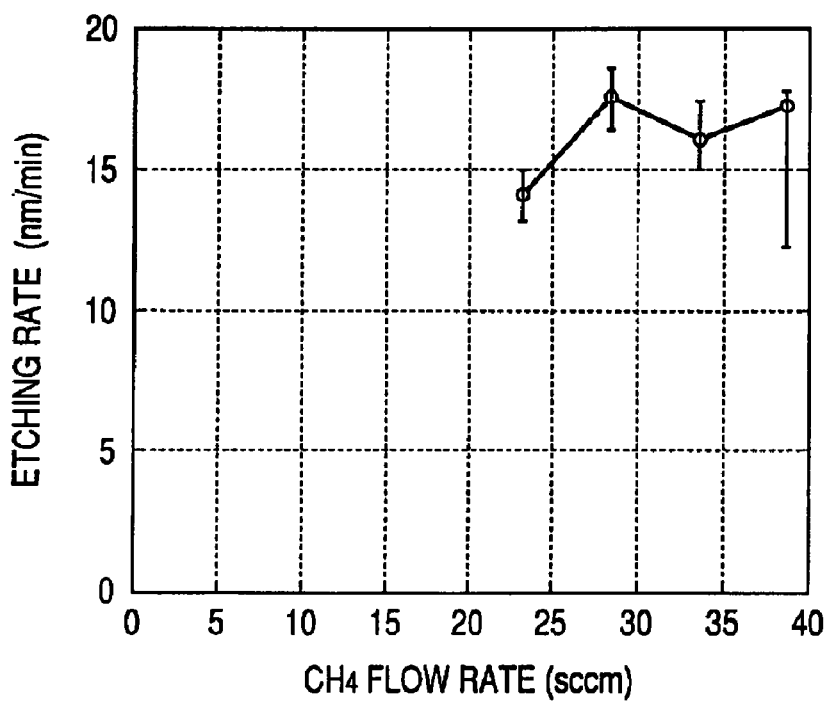
FIG. 3 is a characteristics graph illustrating a relationship between a $CH_4$ flow rate and an etching rate according to the example of the present invention.

In Example 3, a relationship between an etching effect and a pure $CH_4$ flow rate was observed. The observation was performed under such conditions that temperature was set to a room temperature, an RF power was 100 W (2.2 W/cm²), and a chamber pressure was 1.6 Pa. Results of the observation are illustrated in FIG. 3. An axis of abscissa indicates a $CH_4$ flow rate, and an axis of ordinate indicates an etching rate. As apparent from FIG. 3, in a case where the $CH_4$ flow rate is 23 sccm or lower, the plasma is hardly excited, so it is difficult to obtain data thereof. In a case were the $CH_4$ flow rate is 23 sccm or more, it is found that the dry etching is excellently performed without forming the nonvolatile deposit. As illustrate in FIG. 3, it is assumed that, when the $CH_4$ flow rate is 28 sccm or more, the $CH_4$ flow rate is in a range of a surface reaction controlled rate, and when the $CH_4$ flow rate is 28 sccm or lower, the $CH_4$ flow rate is in a range of a supply controlled rate. In order to prevent the deposit from being formed, it is desirable to perform the etching within the range of the supply controlled rate. In a case of the etching apparatus, the $CH_4$ flow rate is desirably 28 sccm or lower. It is assumed that an absolute value thereof changes to some extent depending on a vacuum capability of the etching apparatus.

Example 4

Figure 4:
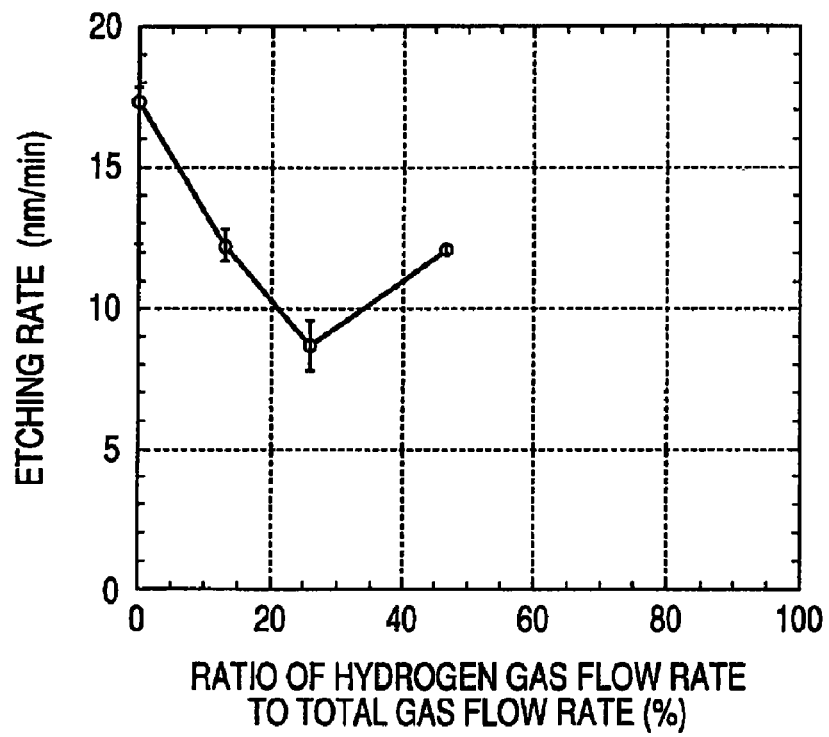
FIG. 4 is a characteristics graph illustrating a relationship between a ratio of a hydrogen gas and an etching rate according to the example of the present invention.

In Example 4, a relationship between an etching effect and addition of the hydrogen gas was observed. The observation was performed under such conditions that temperature was set to a room temperature, an RF power was 100 W (2.2 W/cm²), a chamber pressure was 1.6 Pa, a total gas flow rate of 38.7 sccm. Results obtained through etching by adding the hydrogen gas to $CH_4$ are illustrated in FIG. 4. An axis of abscissa indicates a ratio of a hydrogen gas ($H_2$ flow rate/($CH_4$ flow rate+$H_2$ flow rate)), and an axis of ordinate indicates an etching rate. When the ratio of $H_2$ in the mixture gas exceeds about 45%, the plasma is hardly excited, so it is difficult to obtain data thereof. Accordingly, it is assumed that, when the ratio of $H_2$ is 45% or more, the concentration of $H_2$ increases and the etching rate decreases. As a whole, by adding the hydrogen gas to $CH_4$, the etching rate becomes lower than the etching rate for the pure $CH_4$. When the ratio of the hydrogen gas in the mixture gas is in a range of 25% or more to 45% or less, the etching rate hardly decreases, and the deposition of the nonvolatile materials can be reduced. The range is desirable for the actual production. It is assumed that, the deposition of the nonvolatile materials is reduced due to a reduction effect of hydrogen and due to the fact that the etching of the nonvolatile deposit is performed more easily by adding hydrogen.

From the results, the following was found. That is, setting of the chamber pressure to 3.5 Pa or lower and setting of the RF power to 90 W or more (about 2 W/cm₂) are essential conditions for excellently performing the dry etching without forming the nonvolatile deposit.

Example 5

Figure 5:
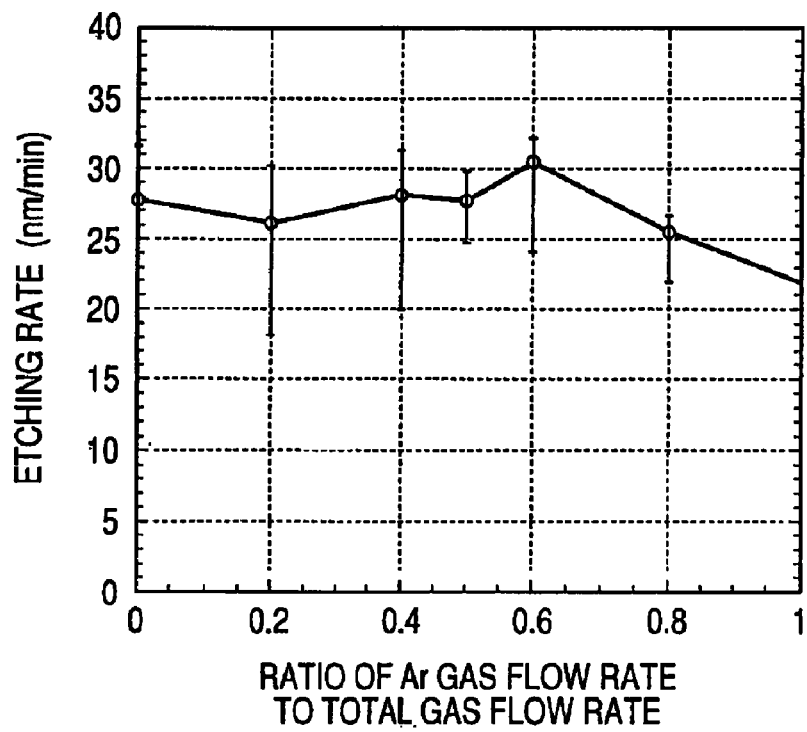
FIG. 5 is a characteristics graph illustrating a relationship between a ratio of an Ar gas and an etching rate according to the example of the present invention.

In Example 5, a relationship between an etching effect and addition of an Ar gas was observed. The observation was performed under such conditions that temperature was set to a room temperature, an RF power was 150 W (3.3 W/cm²), a chamber pressure was 1.6 Pa, and a total gas flow rate was 28 sccm. Results of the observation are illustrated in FIG. 5. An axis of abscissa indicates a ratio of an Ar gas (Ar flow rate/($CH_4$ flow rate+Ar flow rate)), and an axis of ordinate indicates an etching rate. As apparent from FIG. 5, when the ratio of Ar is 50% or lower, the etching rate is substantially constant. When the ratio of Ar is 60%, a maximum etching rate is obtained. When the ratio of Ar is 60% or more, the etching rate decreases as the ratio of Ar increases. When the ratio of Ar is 80% or more, the etching rate is lower than the etching rate for the pure $CH_4$, and an etching selectivity with respect to the resist rapidly decreases, which is undesirable.

Further, based on data obtained in Example 5, a TFT having the transparent conductive oxide amorphous thin film used as a channel layer was produced. It was found that, when the ratio of Ar was 5 mol % or more in the mixture gas of a hydrocarbon and Ar, the production yield of the TFT was substantially 100%.

In Example 5, the nonvolatile deposit was not formed. It is apparent that, by addition of Ar, the plasma is stabilized, and the resist is likely to be removed after the etching.

In the above-mentioned processes, the temperature of a heating mechanism is set to a room temperature (about 20 to 24° C.) without intentionally increasing the temperature of the substrate. Specifically, by flowing a coolant having the room temperature into an inside of a substrate holder, the etching was performed at a temperature close to the room temperature. Then, when a temperature of a substrate surface for a test was measured using a Thermolabel (manufactured by former Nichiyu Giken Kogyo Co., Ltd.), the temperature increased to about 85° C. at the RF power of 100 W after an etching time of 18 minutes. The temperature is a maximum temperature in the etching process according to the present invention. In this example, the entire etching process was performed at the temperature within a range from the room temperature to 85° C.

It should be noted that an etching state of the resist used as the etching mask in this example was also observed. It is found that, even when the resist is exposed to the pure $CH_4$ plasma for a long period of time, the film thickness of the resist hardly changes, and the high etching selectivity (about 100) with respect to the resist can be obtained. Note that when argon is mixed, the etching selectivity with respect to the resist rapidly decreases.

According to the present invention, it is possible to obtain a dry etching process for an oxide semiconductor film made of In—Ga—Zn—O which is formed on a substrate, and to provide, on a substrate, a semiconductor device having a stable and uniform electric property.

For example, the present invention is applicable not only to a TFT in which a transparent oxide film is used as an active layer of the TFT on a plastic film having a flexibility, but also to fields of, for example, a pixel driver for a flexible display, an IC card for authentication, and an IC tag for a product.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-163464, filed Jun. 13, 2006, which is hereby incorporated by reference herein in its entirety.

What is claimed is:

1. A dry etching method for an amorphous oxide semiconductor film containing at least In, Ga, and Zn and having an electron carrier concentration of less than $10^{18}/cm^3$ by use of plasma, comprising etching in a gas atmosphere containing a hydrocarbon, wherein the etching is performed with a reaction pressure in a range of 0.6 Pa or more to 3.5 Pa or less to suppress generation of a deposit of a nonvolatile material, with an RF power density in a range of 0.1 W/cm$^2$ or more to 20 W/cm$^2$ or less and with a surface temperature of the amorphous oxide semiconductor film in a range of −20° C. or more to 200° C. or less.

2. The dry etching method for an amorphous oxide semiconductor film according to claim 1, wherein the hydrocarbon is at least one selected from the group consisting of methane ($CH_4$), ethane ($C_2H_6$), propane ($C_3H_8$), butane ($C_4H_{10}$), ethylene ($C_2H_4$), propylene ($C_3H_6$) and acetylene ($C_2H_2$).

3. The dry etching method for an amorphous oxide semiconductor film according to claim 1, wherein the etching is performed using a gas comprising a mixture gas of a hydrocarbon and Ar.

4. The dry etching method for an amorphous oxide semiconductor film according to claim 3, wherein a ratio of the Ar in the mixture gas of a hydrocarbon and Ar is in a range of 5 mol % or more to 80 mol % or less.

* * * * *